United States Patent
Rehder et al.

(10) Patent No.: US 11,581,446 B2
(45) Date of Patent: Feb. 14, 2023

(54) SEMICONDUCTOR DEVICE INCLUDING AN ELECTRICALLY CONDUCTIVE ADHESIVE LAYER AND A BYPASS DIODE IN A CARRIER

(71) Applicant: The Boeing Company, Chicago, IL (US)

(72) Inventors: Eric M. Rehder, Los Angeles, CA (US); Xiaobo Zhang, Los Angeles, CA (US); Joseph C. Boisvert, Thousand Oaks, CA (US); Peichen Pien, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 494 days.

(21) Appl. No.: 14/877,980

(22) Filed: Oct. 8, 2015

(65) Prior Publication Data
US 2017/0104107 A1 Apr. 13, 2017

(51) Int. Cl.
*H01L 31/02* (2006.01)
*H01L 31/05* (2014.01)
*H01L 31/043* (2014.01)
*H01L 31/0224* (2006.01)
*H01L 31/18* (2006.01)

(52) U.S. Cl.
CPC .. *H01L 31/0508* (2013.01); *H01L 31/022425* (2013.01); *H01L 31/043* (2014.12); *H01L 31/1892* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 5,019,176 A * | 5/1991 | Brandhorst, Jr. | H01L 31/022425 136/244 |
| 6,020,646 A * | 2/2000 | Boyle | H01L 21/563 257/433 |
| 6,340,812 B1 * | 1/2002 | Izumi | H01L 27/14665 250/208.1 |
| 8,283,558 B2 | 10/2012 | Kukulka | |
| 2005/0082655 A1 * | 4/2005 | Nishi | H01L 31/0203 257/678 |
| 2006/0021565 A1 * | 2/2006 | Zahler | H01L 31/0288 117/89 |
| 2008/0190479 A1 * | 8/2008 | Hsieh | H01L 25/0756 136/246 |
| 2009/0235972 A1 * | 9/2009 | Fukushima | H01L 31/0512 136/244 |

(Continued)

OTHER PUBLICATIONS

Sameshima, Toshiyuki, et al.; Multi Junction Solar Cells Stacked with Transparent and Conductive Adhesive; Japanese Journal of Applied Physics, 50, 052301 (Year: 2011).*

(Continued)

*Primary Examiner* — Edward Schmiedel
(74) *Attorney, Agent, or Firm* — Vivacqua Crane, PLLC

(57) ABSTRACT

A solar cell structure is disclosed. The solar cell structure comprises a carrier having a front side and a P-N junction, a solar cell electrically coupled to the front side of the carrier, and an adhesive layer. The adhesive layer bonds the front side of the carrier to the solar cell. The adhesive layer includes conductive particles that electrically couple the carrier to the solar cell.

18 Claims, 5 Drawing Sheets

(56) References Cited

U.S. PATENT DOCUMENTS

| | | | | |
|---|---|---|---|---|
| 2010/0108141 A1* | 5/2010 | Fukushima | ................ | C09J 5/06 |
| | | | | 136/256 |
| 2011/0277820 A1* | 11/2011 | Ho | ..................... | H01L 27/1421 |
| | | | | 136/249 |
| 2012/0073635 A1* | 3/2012 | Lee | ..................... | H01G 9/2072 |
| | | | | 136/255 |
| 2015/0007864 A1 | 1/2015 | Chiu et al. | | |

OTHER PUBLICATIONS

Zemen, Y, et al.; Comparison of new conductive adhesives based on silver and carbon nanotubes for solar cells interconnection; Solar energy materials & solar cells, 109, pp. 155-159; published online Nov. 24, 2012 (Year: 2012).*

Ren, Guoqiang. "Carbon nanotube". Encyclopedia Britannica, Nov. 16, 2018, https://www.britannica.com/science/carbon-nanotube. Accessed Feb. 17, 2021. (Year: 2018).*

"Carbon Nanotube"; New World Encyclopedia; available online Jun. 28, 2013; https://www.newworldencyclopedia.org/entry/Carbon_nanotube; accessed and printed Feb. 17, 2021 (Year: 2013).*

* cited by examiner

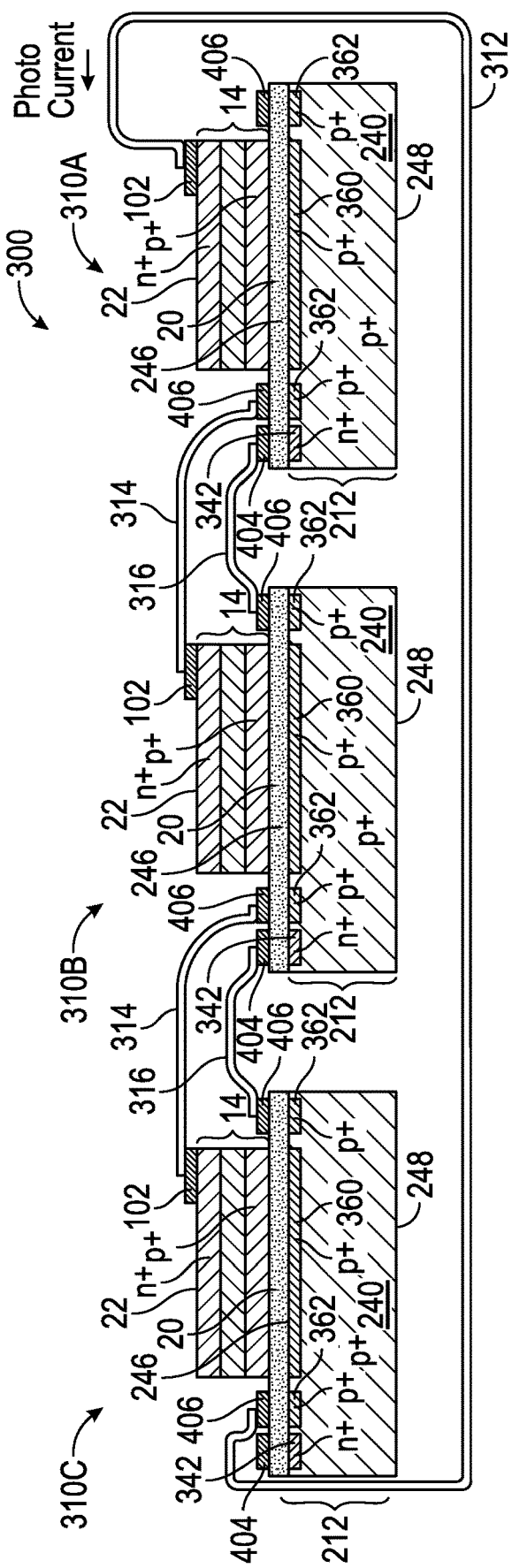
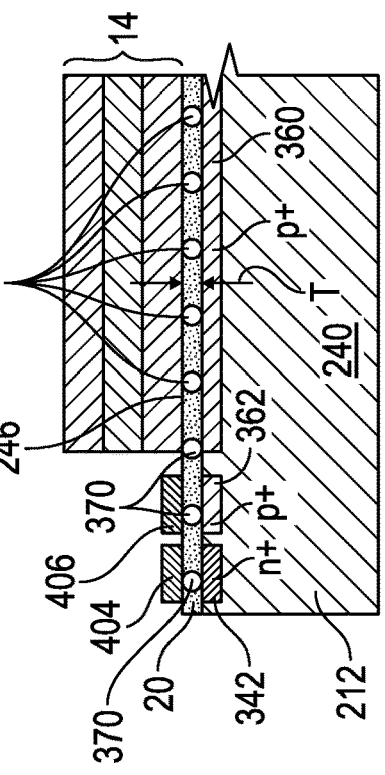
FIG. 5
FIG. 6

SEMICONDUCTOR DEVICE INCLUDING AN ELECTRICALLY CONDUCTIVE ADHESIVE LAYER AND A BYPASS DIODE IN A CARRIER

This disclosure was made with U.S. Government support under Contract No. FA8650-12-C-5501 awarded by the Department of Defense. The U.S. Government has certain rights in this disclosure.

FIELD

The disclosed system and method relate to a solar cell structure and, more particularly, to a solar cell structure including a carrier with a P-N junction, where the carrier is adhesively bonded and electrically coupled to a solar cell using an adhesive layer that includes conductive particles.

BACKGROUND

The voltage and current output of a solar cell may be limited. Therefore, multiple solar cells are typically electrically interconnected, such as in series, to form a circuit that produces higher voltages than are possible with a single solar cell. A typical solar panel is formed by electrically connecting several circuits, in parallel or in series, in order to produce higher currents or higher voltages. If one of the solar cells of a circuit is shaded while the remaining solar cells are fully illuminated, the shaded solar cell may be subjected to a reverse-bias condition by the continuing voltage and current output produced by the remaining illuminated solar cells. Thus, by-pass diodes may be provided for each solar cell to protect against the reverse-bias condition. Specifically, a by-pass diode may be used to block current if the solar cell is not reverse biased, but passes current when the solar cell is reverse biased. It is to be appreciated that while there are various techniques currently available for incorporating by-pass diodes into solar cells, there is a continuing need in the art for new approaches to include a by-pass diode within a solar cell structure.

In one particular approach, a solar cell may be constructed of Group III-V materials such as indium phosphide (InP) and gallium arsenide (GaAs). The solar cell may be connected to a carrier using a metal-to-metal bond. Specifically, the carrier may be constructed of a silicon material, such as a single crystal or a polycrystalline material. While the use of silicon material for the carrier may be beneficial for various reasons, it should also be appreciated that the metal-to-metal layers used to connect the carrier to the solar cell include a coefficient of thermal expansion (CTE) that is significantly higher than the CTE of GaAs or silicon. Specifically, silicon has a CTE of about 2.5, GaAs has a CTE of about 5.5, and the metal-to-metal layer has a CTE that ranges between 10 to 20. As a result, the metal-to-metal layers are typically limited in use to relatively small devices such as light emitting diodes (LEDs), which are only a few millimeters in dimension. However, those of ordinary skill in the art will readily appreciate that solar cells are typically significantly larger in size than a device such as an LED. Thus, there is a continuing need in the art for an improved connecting bond that manages the differences in the CTE between the materials used for the carrier and the solar cell more effectively than existing solutions.

SUMMARY

In one example, a solar cell structure is disclosed. The solar cell structure comprises a carrier having a front side and a P-N junction, a solar cell electrically coupled to the front side of the carrier, and an adhesive layer. The adhesive layer bonds the front side of the carrier to the solar cell. The adhesive layer includes conductive particles that electrically couple the carrier to the solar cell.

In another example, a solar cell array is disclosed and includes a plurality of solar cell structures electrically connected to one another. Each solar cell structure comprises a carrier having a front side and a P-N junction, a solar cell electrically coupled to the front side of the carrier, and an adhesive layer. The adhesive layer bonds the front side of the carrier to the solar cell. The adhesive layer includes conductive particles that electrically couple the carrier to the solar cell.

In yet another example, a method of assembling a solar cell structure is disclosed. The method includes providing a carrier having a front side and a P-N junction and a solar cell. The method also includes bonding the front side of the carrier to the solar cell by an adhesive layer. The adhesive layer includes conductive particles that electrically couple the carrier to the solar cell.

Other objects and advantages of the disclosed method and system will be apparent from the following description, the accompanying drawings and the appended claims.

BRIEF DESCRIPTION OF THE DRAWINGS

FIG. 5 is an alternative example of the solar cell array shown in FIG. 4, where the interconnects for each solar cell assembly are front side interconnects;

FIG. 6 is an enlarged view of one of the solar cell assemblies shown in FIG. 5, illustrating conductive particles in an adhesive layer.

DETAILED DESCRIPTION

Figure 1:
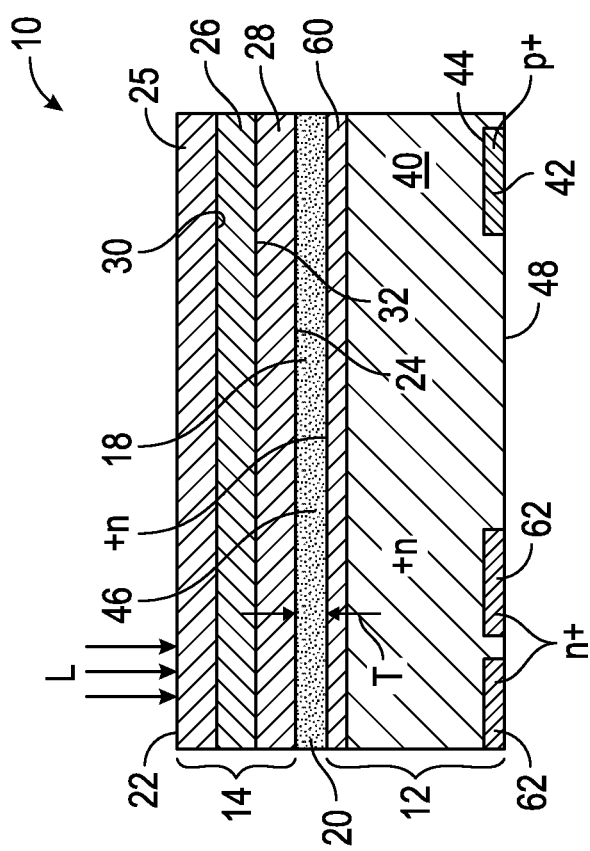
FIG. 1 is an illustration of an example of the disclosed solar cell assembly.

FIG. 1 is an illustration of an example of the disclosed solar cell assembly 10. The solar cell assembly 10 may include a carrier 12 and a solar cell 14, which is bonded to the carrier 12 by an adhesive layer 20. As explained in greater detail below, the adhesive layer 20 is constructed of an adhesive 18 that includes conductive particles that conduct electricity. The solar cell 14 may also include additional layers such as, for example, a front contact metallization layer, an anti-reflecting coating layer, and a cover glass layer (not illustrated). The solar cell 14 defines a front side 22 and a back side 24, where the solar cell 14 produces a voltage across both the front side 22 and the back side 24 if the front side 22 of the solar cell 14 is illuminated by incident light L.

For example, the incident light L may be produced by the sun. The solar cell 14 may include multiple layers 25, 26, and 28 of semiconductor material that define junctions 30, 32 therebetween. The semiconductor layers 25, 26, and 28 may be constructed of Group III-V materials such as, but not limited to, indium phosphide (InP) and gallium arsenide (GaAs).

In the exemplary example as illustrated in FIG. 1, a portion of the carrier 12 is constructed of a portion of a n-doped semiconductor material 40, and a remaining portion of the carrier 12 is constructed of a p-doped semiconductor material 42, which defines a P-N junction 44 within the carrier 12. In the example as shown in FIG. 1, the p-doped semiconductor material 42 is located along a back side 48 of the carrier 12. However, as explained in greater detail below and as shown in FIG. 5, it should be appreciated that the p-doped semiconductor material 42 may be located along a front side 46 of the carrier 12 as well. The carrier 12 may be constructed of a silicon material, such as a single crystal silicon or polycrystalline silicon.

Figure 4:
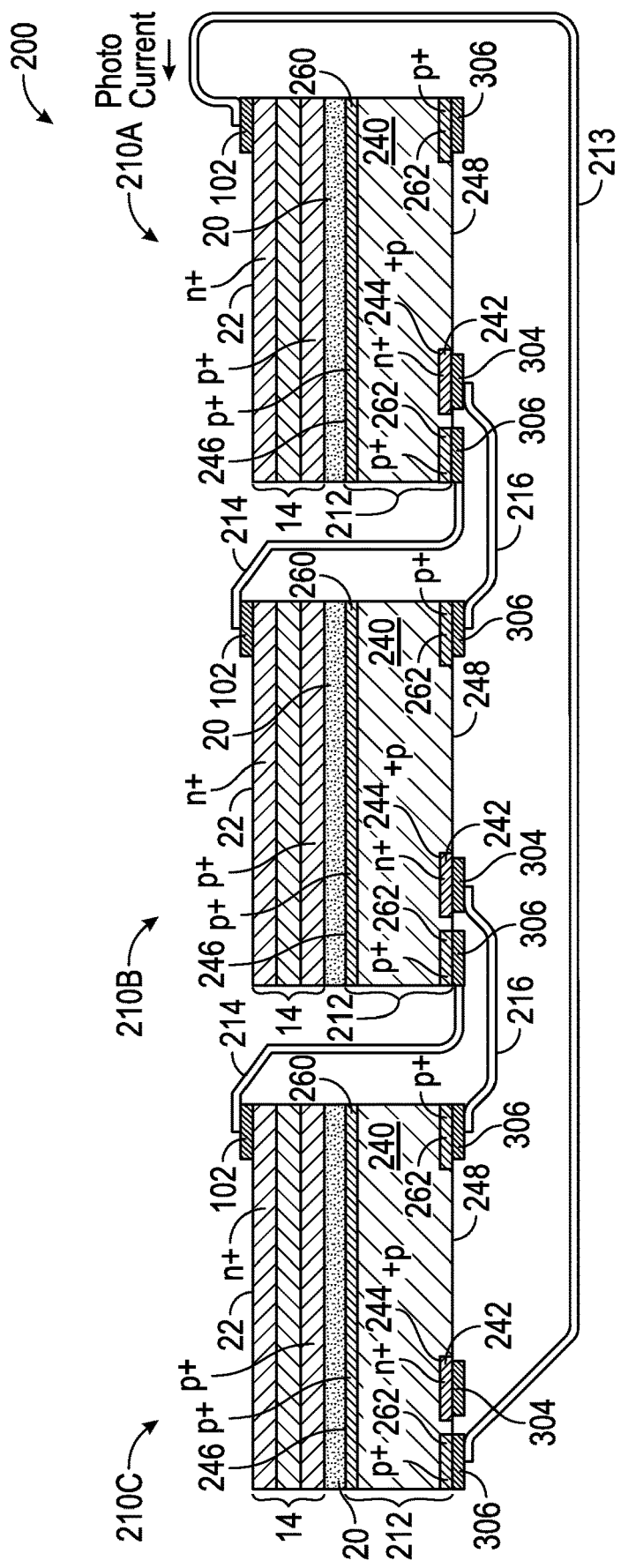
FIG. 4 is an alternative example of a solar cell array including a plurality of solar cells having a p-doped substrate, where each solar cell assembly is electrically protected by a by-pass diode located in the carrier of an adjacent solar cell.
Figure 7:
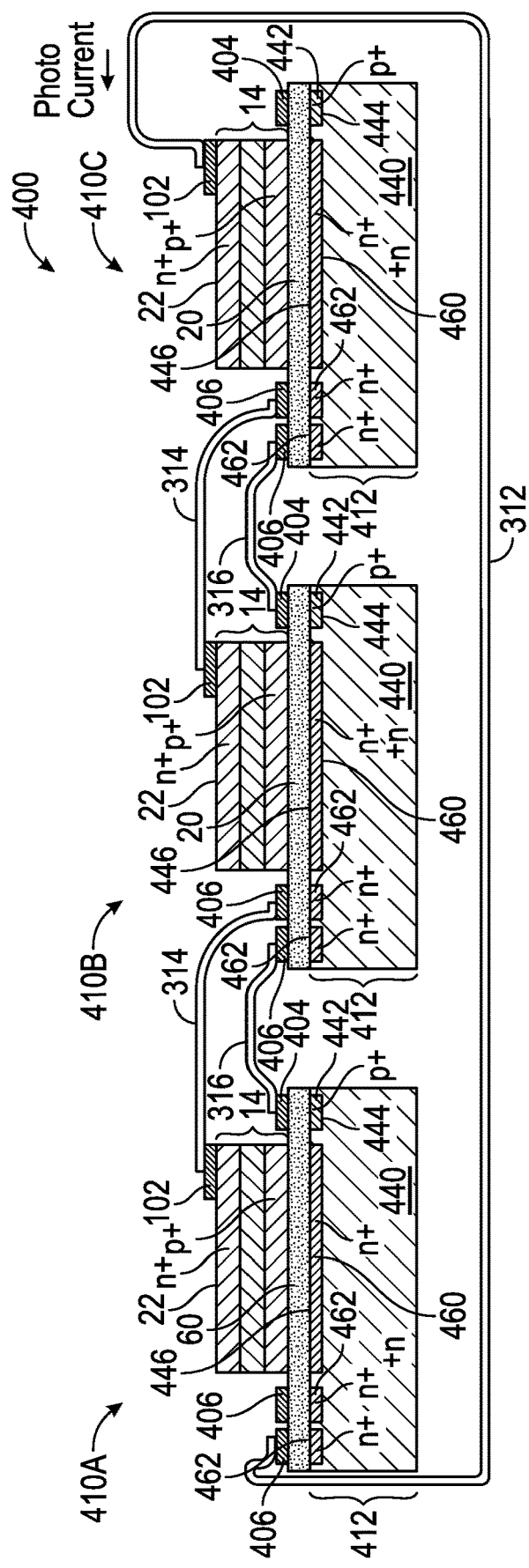
FIG. 7 is an alternative example of the solar cell array shown in FIG. 5, where each solar cell assembly is electrically protected by its own by-pass diode.

The n-doped semiconductor material 40 of the carrier 12 may include one or more portions of highly n-doped semiconductor material. Specifically, a highly n-doped semiconductor material may include an n-doping concentration of about $2 \times 10^{20}/cm^3$. In contrast, the remaining portion of the n-doped semiconductor material 40 of the carrier 12 may include an n-doping concentration of about $2 \times 10^{17}/cm^3$. In the example as shown in FIG. 1, a front highly n-doped portion 60 is located along the front side 46 of the carrier 12, and two highly n-doped portions 62 are located along a portion of the back side 48 of the carrier 12. It is to be appreciated that the example as illustrated in FIG. 1 is merely exemplary in nature and that highly n-doped portions of semiconductor material may be located along other areas of the carrier 12 as well depending on the specific configuration of the solar cell assembly 10. Several alternative examples of the carrier 12 are illustrated in FIGS. 4-5 and 7, and are described in greater detail below.

Figure 2:
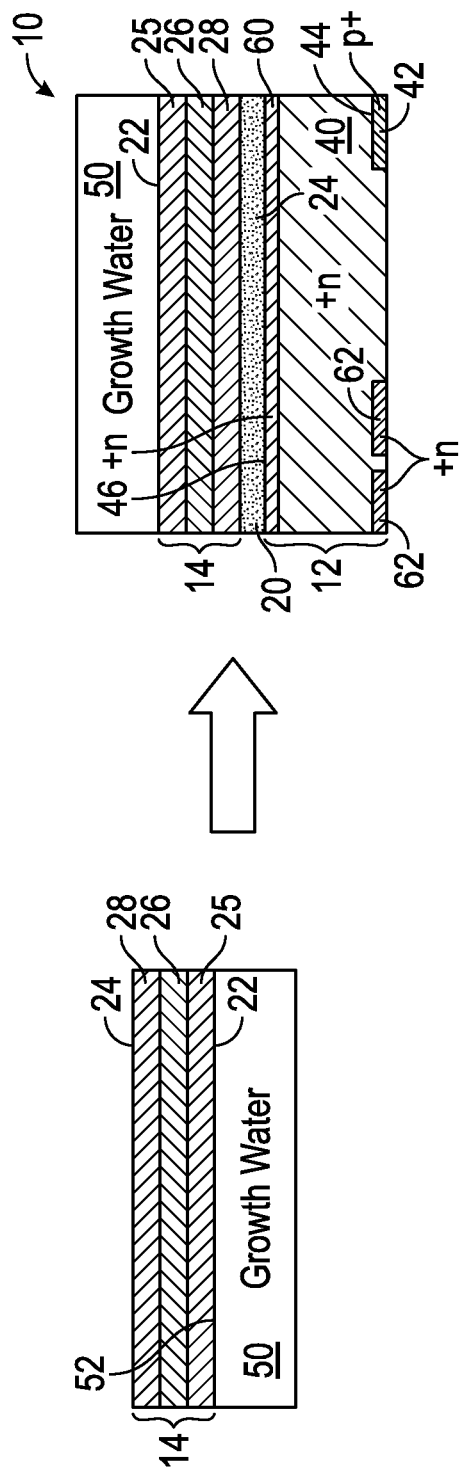
FIG. 2 is an illustration of the solar cell assembly shown in FIG. 1 being grown upon a temporary growth substrate and then transferred to a carrier.

The carrier 12 may be a substantially flat, planar structure that acts as a handle wafer. The handle wafer may also be referred to as a support wafer. Specifically, referring to FIG. 2, the various semiconductor layers 25, 26, and 28 may be initially formed on a temporary growth substrate 50. For example, the temporary growth substrate 50 may be constructed of germanium. As seen in FIG. 2, the front side 22 of the solar cell 14 may be grown upon a front surface 52 of the temporary growth substrate 50. The solar cell 14 may be epitaxially grown upon the temporary growth substrate 50, however, it is to be appreciated that other approaches may be used as well to grow the solar cell 14 upon the temporary growth substrate 50. Once the solar cell 14 has been grown upon the temporary growth substrate 50, the adhesive layer 20 may then be layered along the back side 24 of the solar cell 14. The solar cell 14 may then be flipped over, and the back side 24 of the solar cell 14 may be adhesively bonded to the front side 46 of the carrier 12. Once the solar cell 14 is bonded to the carrier 12, then the temporary growth substrate 50 may be removed from the solar cell 14 using any known technique.

Turning back to FIG. 1, the P-N junction 44 within the carrier 12 may be created using any available technique, such as diffusion and growth techniques like chemical vapor deposition. In one example, the carrier 12 may be formed by starting with a n-type silicon wafer and diffusing a dopant relative to the n-type silicon wafer to form the portion of p-doped semiconductor material 42 on the wafer and, thus, the P-N junction 44. In another example, the carrier 12 may be formed by starting with a p-type silicon wafer and diffusing a dopant relative to the p-type silicon wafer to form the portion of n-doped semiconductor material 40 and, thus, the P-N junction 44.

The adhesive layer 20 is located between the back side 24 of the solar cell 14 and the front side 46 of the carrier 12, and bonds the solar cell 14 to the carrier 12. The adhesive 18 may be, for example, benzocyclobutene (BCB), SU-8 photoresist, and spin-on glass. The adhesive 18 also includes conductive particles that act as contacts to electrically couple the solar cell 14 to the carrier 12 to one another. As described in greater detail below, the conductive particles may each be in electrical contact with both the solar cell 14 and the carrier 12. Thus, the conductive particles may form conduction paths through the adhesive 18 of the adhesive layer 20.

The conductive particles may be, for example, metal particles, carbon nanostructures, such as carbon nanotubes, or particles coated with an electrically conductive material (e.g., polymer spheres coated with metal). In one specific example, the conductive particles may be metal particles constructed of indium or tin alloys. The size of the conductive particles may be dictated by the cross-sectional thickness T of the adhesive layer 20. That is, the conductive particles are sized so as to have about the same size as a cross-sectional thickness T of the adhesive layer 20. Thus, it is to be appreciated that the conductive particles may each make electrical contact with both the solar cell 14 and the carrier 12. In one example, the cross-sectional thickness T of the adhesive layer 20 may range from about 1 to about 20 μm. It is to be appreciated that since the conductive particles are in electrical contact with both the solar cell 14 and the carrier 12, then no additional conductive particles are needed to complete an electrical path through the adhesive, and as a result the concentration of conductive particles within the adhesive 18 may be relatively low. Furthermore, it should also be appreciated that since the concentration of conductive particles within the adhesive 18 is relatively low, the conductive particles do not generally make contact with one another. For example, the concentration of conductive particles within the adhesive 18 is from about 0.1% to about 1.0% by volume. Furthermore, as explained in greater detail below, the conductive particles (shown in FIG. 6 as conductive particles 370) are anisotropic conductors. Since the conductive particles are anisotropic conductors, the conductive particles may only conduct electricity in a direction that extends between the solar cell 14 and the carrier 12. As explained in greater detail below and shown in FIG. 6, because the conductive particles are anisotropic conductors, a separate etching process may not be required.

Figure 3:
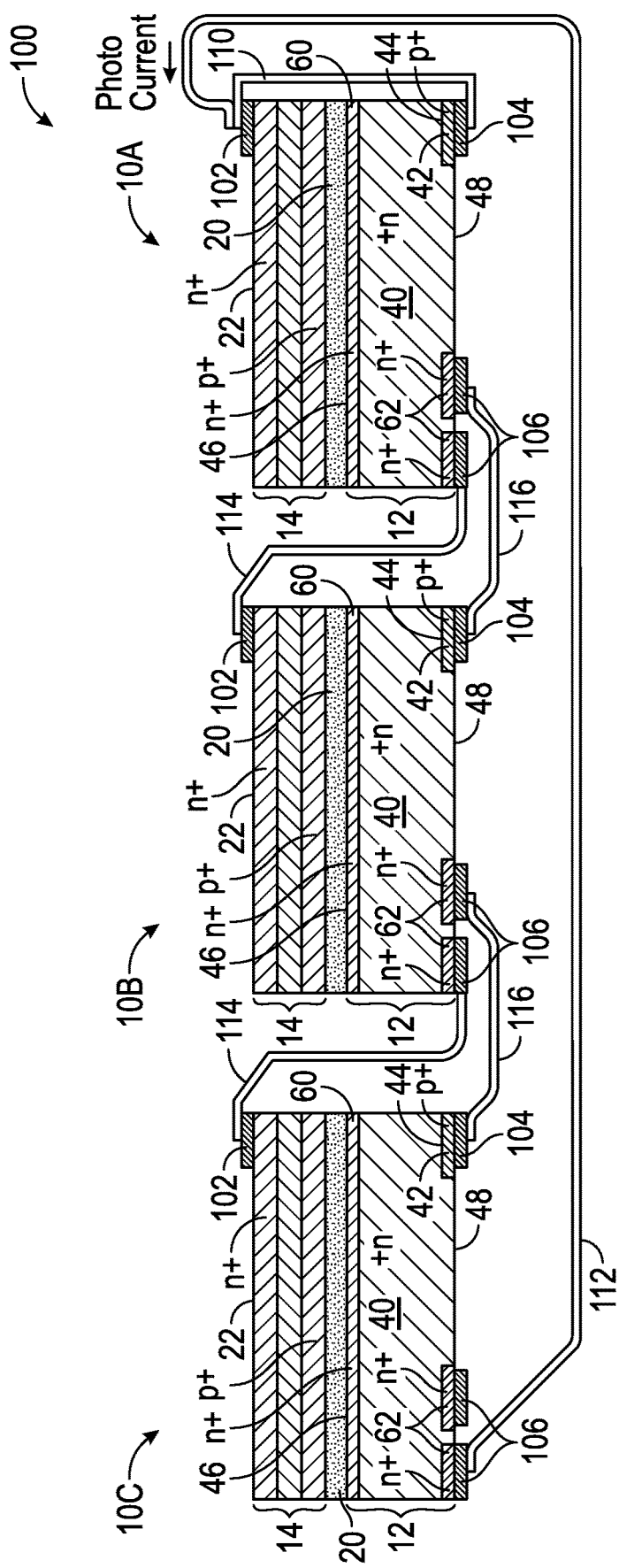
FIG. 3 is an illustration of a solar cell array including a plurality of the solar cells shown in FIG. 1 electrically connected to one another in series, where each solar cell assembly is electrically protected by a by-pass diode located in the carrier.

FIG. 3 is an illustration of a solar cell array 100 where a plurality of solar cell assemblies 10A, 10B, and 10C are electrically connected to one another in series. Specifically, a front connection pad 102 may be metalized upon the front side 22 of each solar cell 14 to electrically contact the solar cell 14. A first rear connect pad 104 may be metalized on the back side 48 of the carrier 12 of each solar cell assembly 10A, 10B, and 10C to electrically contact the p-doped semiconductor material 42 of the carrier 12. Two rear contact pads 106 may each be metalized along the back side 48 of the carrier 12 of each solar cell assembly 10. Each rear contact pad 106 electrically contacts one of the two highly n-doped portions 62 of the carrier 12.

As seen in FIG. 3, a wrap-around metallization layer 110 may be used to electrically couple the front side 22 of the solar cell 14 of a first solar assembly 10A with the p-doped semiconductor material 42 of the carrier 12. As explained above, the adhesive layer 20 includes conductive particles that act as contacts that electrically couple each of the solar cells 14 to the respective carriers 12 of each solar assembly 10A, 10B, and 10C. Thus, the carrier 12 of solar assembly 10A may act as a by-pass diode for the first solar assembly 10A. Furthermore, an interconnect 112 may be used to electrically couple the front side 22 of the solar cell 14 of the first solar assembly 10A with one of the two highly n-doped portions 62, which have an n-doping concentration of about $2 \times 10^{20}/cm^3$, located along the back side 48 of the carrier 12 of a third solar cell 10C.

Continuing to refer to FIG. 3, an interconnect 114 may be provided to connect one of the two highly n-doped portions 62 located along the back side 48 of the carrier 12 of the solar cell assemblies 10A and 10B with the front side 22 of the solar cell 14 of an adjacent one of the solar cell assemblies 10B, and 10C. Another interconnect 116 may be provided to connect the remaining one of the highly n-doped portions 62 located along the back side 48 of the carrier 12 of the solar cell assemblies 10A and 10B with the p-doped semiconductor material 42 of the carrier 12 of one of the solar cell assemblies 10B, and 10C. It is to be appreciated that each solar cell assembly 10A, 10B, and 10C is electrically protected by its own respective by-pass diode. In other words, the by-pass diode protects the specific solar cell assembly that the by-pass diode is constructed of (i.e., the by-pass diode that is part of the solar cell structure 10A protects the solar cell structure 10A). Thus, it is to be appreciated that each solar cell assembly 10A, 10B, and 10C may be protected.

FIG. 4 is an alternative example of a solar cell array 200 including a plurality of solar cell assemblies 210A, 210B, and 210C. The example as shown in FIG. 4 includes a similar structure as the solar cell array 100 shown in FIG. 3, however, each solar cell assembly 210A, 210B, and 210C is electrically protected by a by-pass diode located on an adjacent solar cell assembly. For example, the by-pass diode located on the solar cell assembly 210A protects the solar cell assembly 210B. However, it should be appreciated that the solar cell assembly 210A is unprotected. Furthermore, unlike the example as shown in FIG. 3, a majority of a carrier 212 of each solar cell 210A, 210B, and 210C is constructed of a portion of p-doped semiconductor material 240, and a remaining portion of the carrier 212 is constructed of a n-doped semiconductor material 242, which defines a P-N junction 244 within the carrier 212. The p-doped semiconductor material 240 of the carrier 212 may include one or more portions of highly p-doped semiconductor material. Specifically, a highly p-doped semiconductor material may include a p-doping concentration of about $2 \times 10^{20}/cm^3$.

In the example as shown in FIG. 4, the n-doped semiconductor material 242 is located along a back side 248 of the carrier 212 of each solar cell 210A, 210B, and 210C. A first rear connect pad 304 may be metalized on the back side 248 of the carrier 212 of each solar cell assembly 210A, 210B, and 210C to electrically contact the n-doped semiconductor material 242 of the carrier 212. Two rear contact pads 306 may each be metalized along the back side 248 of the carrier 212 of each solar cell assembly 10. Each rear contact pad 306 electrically contacts one of two highly p-doped portions 262 of the carrier 212. It is to be appreciated that the carrier 212 may also include a highly p-doped portion 260 located along a front side 246 of the carrier 212 as well.

An interconnect 213 may be used to electrically couple the front side 22 of the solar cell 14 of the first solar assembly 210A with one of the two highly p-doped portions 262 located along the back side 248 of the carrier 212 of a third solar cell 210C. Continuing to refer to FIG. 4, an interconnect 214 may be provided to connect one of the two highly p-doped portions 262 located along the back side 248 of the carrier 212 of the solar cell assemblies 210A and 210B with the front side 22 of the solar cell 14 of an adjacent one of the solar cell assemblies 210B, and 210C. Another interconnect 216 may be provided to connect the remaining one of the n-doped portions 242 located along the back side 248 of the carrier 212 of one of the solar cell assemblies 210A and 210B with the highly p-doped portions 262 located along the back side 248 of the carrier 212 of one of the adjacent solar cell assemblies 210B and 210C.

FIG. 5 is an alternative example of a solar cell array 300 with a plurality of solar cell assemblies 310A, 310B, and 310C. The example as shown in FIG. 5 includes a similar structure as the solar cell array 200 shown in FIG. 4, however, the interconnects for each solar cell assembly 310A, 310B, and 310C are all front side interconnects. Those of ordinary skill in the art will appreciate that same-side interconnects, such as front interconnects, may be more efficient and easy to assemble when compared to devices based on a two-sided interconnect design. In the example as shown in FIG. 5, a n-doped semiconductor material 342 is located along the front side 246 of the carrier 212 of each solar cell 210A, 210B, and 210C. A first front connect pad 404 may be metalized on the front side 246 of the carrier 212 of each solar cell assembly 310A, 310B, and 310C to electrically contact the n-doped semiconductor material 342 of the carrier 212.

Two highly p-doped portions 362 may also be located along the front side 246 of the carrier 212. Two front contact pads 406 may each be metalized along the front side 248 of the carrier 212 of each solar cell assembly 310A, 310B, and 310C. Each front contact pad 406 electrically contacts one of two highly p-doped portions 362 of the carrier 212. It is to be appreciated that the carrier 212 may also include a highly p-doped portion 360 located along the front side 246 of the carrier 212 as well, where the highly p-doped portion 360 is situated directly below the solar cell 14.

An interconnect 312 may be used to electrically couple the front side 22 of the solar cell 14 of the first solar assembly 310A with one of the two highly p-doped portions 362 located along the front side 348 of the carrier 212 of a third solar cell 310C. Continuing to refer to FIG. 5, an interconnect 314 may be provided to connect one of the two highly p-doped portions 362 located along the front side 246 of the carrier 212 of the solar cell assemblies 310A and 310B with the front side 22 of the solar cell 14 of an adjacent one of the solar cell assemblies 310B and 310C. Another interconnect 316 may be provided to connect the n-doped portion 342 located along the front side 248 of the carrier 212 of one of the solar cell assemblies 310A and 310B with the remaining highly p-doped portion 362 located along the front side 246 of the carrier 212 of one of the adjacent solar cell assemblies 310B and 310C.

FIG. 6 is an enlarged view of a portion of one of the solar cell assemblies 310A, 310B, or 310C illustrating the n-doped semiconductor material 342 as well as one of the highly p-doped portions 362, which are both located along the front side 246 of the carrier 212. Furthermore, FIG. 6 also illustrates the conductive particles 370 within the adhesive layer 20. As seen in FIG. 6, the conductive particles 370 are spaced about equidistant from one another, however it is to be appreciated that this illustration is not to scale, and the conductive particles 370 are not typically spaced equally apart. As also seen in FIG. 6, the conducting particles 370 are sized about the same as the cross-sectional thickness T of the adhesive layer 20. Thus, the conductive particles 370 are anisotropic conductors. Thus, the conductive particles 370 may only conduct electricity in a longitudinal and not a lateral direction within the solar cell. In other words, the conductive particles 370 only allow for electricity to flow between the carrier 212 and the front connect pad 404, between the carrier 212 and the front contact pad 406, or between the carrier 212 and the solar cell 14. Therefore, it should be appreciated that the adhesive layer 20 may not need to be etched in order to avoid electrical conduction in the lateral direction, which in turn may reduce the number of processes in assembly and reduce cost. In contrast, metal bonding layers and conducting epoxies conduct electricity in all directions. Thus, metal bonding layers and conducting epoxies need to be etched in order to avoid electrical conduction in the lateral direction.

FIG. 7 is an alternative example of a solar cell array 400 including a plurality of solar cell assemblies 410A, 410B, and 410C. The example as shown in FIG. 7 includes a similar structure as the solar cell array 300 shown in FIG. 5, however each solar cell assembly 410A, 410B, and 410C' is electrically protected by its own by-pass diode, and not a by-pass diode located on an adjacent solar cell assembly. Furthermore, unlike the example as shown in FIG. 6, a portion of a carrier 412 of each solar cell 410A, 410B, and 410C is constructed of a portion of n-doped semiconductor material 440, and a remaining portion of the carrier 412 is constructed of a p-doped semiconductor material 442, which defines a P-N junction 444 within the carrier 412.

In the example as shown in FIG. 7, the p-doped semiconductor material 442 is located along a front side 446 of the carrier 412 of each solar cell 410A, 410B, and 410C. The first front connect pad 404 may be metalized on the front side 446 of the carrier 212 of each solar cell assembly 410A, 410B, and 410C to electrically contact the p-doped semiconductor material 442 of the carrier 212. Two highly n-doped portions 462 may also be located along the front side 446 of the carrier 412. Two front contact pads 406 may each be metalized along the front side 248 of the carrier 212 of each solar cell assembly 410A, 410B, and 410C. The carrier 412 may also include a highly n-doped portion 460 located along the front side 446 of the carrier 412 as well, where the highly n-doped portion 460 is situated directly below the solar cell 14. Those of ordinary skill in the art will appreciate that it may be advantageous to include all doped portions (i.e., the p-doped semiconductor material 442, the highly n-doped portions 462, and the highly n-doped portion 460) along the front side 446 of the carrier 412, as it is easier to dope a substrate using a one-sided process when compared to doping using a two-sided process.

Referring generally to the figures, the disclosed solar cell structure includes a carrier that is bonded to a solar cell using the adhesive layer, which includes conductive particles. The metal-to-metal layers that are currently used to bond the carrier to the solar cell include a coefficient of thermal expansion (CTE) that is significantly higher than the CTE of GaAs and silicon. In contrast, the disclosed adhesive layer does not introduce a significantly higher CTE than GaAs and silicon, thereby providing an improved connecting bond that more effectively manages the differences in CTE between the solar cell and the carrier. Indeed, the disclosed adhesive layer also provides the ability to bond relatively large devices together. Indeed, the disclosed adhesive may bond together large solar cells that range from about 4 cm$^2$ to 144 cm$^2$ in area. Furthermore, because the disclosed adhesive layer also includes a relatively low concentration of conducting particles, the polymer mechanical properties of the adhesive are retained, while still allowing for electrical conduction between the solar cell and the carrier. In addition to the above-mentioned benefits, it should also be appreciated that the P-N junction within the carrier also reduces assembly costs. Furthermore, the P-N junction in the carrier reduces the amount of electrical interconnects and removes a mechanical diode from the solar cell.

While the forms of apparatus and methods herein described constitute preferred embodiments of this invention, it is to be understood that the invention is not limited to these precise forms of apparatus and methods, and the changes may be made therein without departing from the scope of the invention.

What is claimed is:

1. A solar cell structure, comprising:
   a carrier having a front side and a P-N junction;
   a solar cell electrically coupled to the front side of the carrier; and
   an adhesive layer that bonds the front side of the carrier to the solar cell, the adhesive layer including an adhesive material and conductive carbon nanostructures that electrically couple the carrier to the solar cell, wherein the conductive carbon nanostructures within the adhesive layer do not generally contact one another, and wherein the conductive carbon nanostructures are anisotropic conductors that confine electrical conduction within the adhesive layer to a longitudinal direction between the solar cell and carrier.

2. The solar cell of claim 1, wherein the conductive carbon nanostructures are sized about equal to a cross-sectional thickness of the adhesive layer.

3. The solar cell of claim 2, wherein the cross-sectional thickness of the adhesive layer ranges from about 1 to about 20 μm.

4. The solar cell of claim 1, wherein the concentration of conductive carbon nanostructures within the adhesive layer ranges from about 0.1% to about 1.0% by volume.

5. The solar cell of claim 1, wherein the adhesive material is selected from benzocyclobutene (BCB) and SU-8 photoresist.

6. The solar cell of claim 1, wherein a majority of the carrier is constructed of a n-doped semiconductor material, and a remaining portion of the carrier is constructed of a p-doped semiconductor material to define the P-N junction within the carrier.

7. The solar cell of claim 6, wherein the p-doped semiconductor material is located along either the front side of the carrier or a back side of the carrier.

8. The solar cell of claim 1, wherein a majority of the carrier is constructed of a p-doped semiconductor material, and a remaining portion of the carrier is constructed of a n-doped semiconductor material to define the P-N junction within the carrier.

9. The solar cell of claim 8, wherein the p-doped semiconductor material is located along either the front side of the carrier or a back side of the carrier.

10. A solar cell array, comprising:
    a plurality of solar cell structures electrically connected to one another, wherein each solar cell structure comprises:
    a carrier having a front side and a P-N junction;
    a solar cell electrically coupled to the front side of the carrier; and
    an adhesive layer that bonds the front side of the carrier to the solar cell, the adhesive layer including an adhesive material and conductive carbon nanostructures that electrically couple the carrier to the solar cell, wherein the conductive carbon nanostructures within the adhesive layer do not generally contact one another, and wherein the conductive carbon nanostructures are anisotropic conductors that confine electrical conduction within the adhesive layer to a longitudinal direction between the solar cell and carrier.

11. The solar cell array of claim 10, wherein the plurality of solar cell structures are electrically connected to one another in series.

12. The solar cell array of claim 10, wherein each of the plurality of solar cell structures are electrically protected by their own respective by-pass diodes.

13. The solar cell array of claim 10, wherein a portion of the plurality of solar cell structures is protected by a by-pass diode located on an adjacent solar cell assembly.

14. The solar cell array of claim 13, wherein the by-pass diodes are each located along either a front side or a rear side of the adjacent solar cell assembly.

15. The solar cell array of claim 10, wherein the solar cell structures of the plurality of solar cell structures are connected to one another using front side interconnects.

16. The solar cell array of claim 10, wherein the plurality of solar cell structures is electrically protected by a by-pass diode located on an adjacent solar cell structure.

17. A method of assembling a solar cell structure, the method comprising:
 providing a carrier having a front side and a P-N junction and a solar cell; and
 bonding the front side of the carrier to the solar cell by an adhesive layer, wherein the adhesive layer includes an adhesive material and conductive carbon nanostructures that electrically couple the carrier to the solar cell, the conductive carbon nanostructures being anisotropic conductors that confine electrical conduction within the adhesive layer to a longitudinal direction between the solar cell and carrier, and wherein the conductive carbon nanostructures within the adhesive layer do not generally contact one another.

18. The method of claim 17 wherein the concentration of conductive carbon nanostructures within the adhesive layer ranges from about 0.1% to about 1.0% by volume.

* * * * *